United States Patent
Remisch et al.

(10) Patent No.: US 10,381,135 B2
(45) Date of Patent: Aug. 13, 2019

(54) CHARGING CABLE ASSEMBLY

(71) Applicant: Dr. Ing. h.c. F. Porsche Aktiengesellschaft, Stuttgart (DE)

(72) Inventors: Dirk Remisch, Mönsheim (DE); Stefan Staudacher, Eschenbach (DE); Marco Stepper, Tübingen (DE); Erik Weber, Kirchheim unter Teck (DE); Benjamin Schneider, Stuttgart (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 0 days.

(21) Appl. No.: 15/925,923

(22) Filed: Mar. 20, 2018

(65) Prior Publication Data
US 2018/0277283 A1 Sep. 27, 2018

(30) Foreign Application Priority Data
Mar. 21, 2017 (DE) .................... 10 2017 105 985

(51) Int. Cl.
| | |
|---|---|
| *H01B 9/02* | (2006.01) |
| *H01B 7/42* | (2006.01) |
| *B60L 53/16* | (2019.01) |
| *B60L 53/31* | (2019.01) |
| *B60L 53/18* | (2019.01) |
| *B60L 53/302* | (2019.01) |
| *H05K 9/00* | (2006.01) |

(52) U.S. Cl.
CPC .............. *H01B 7/423* (2013.01); *B60L 53/16* (2019.02); *B60L 53/18* (2019.02); *B60L 53/302* (2019.02); *B60L 53/31* (2019.02); *H01B 7/425* (2013.01); *H01B 9/02* (2013.01); *H05K 9/0098* (2013.01)

(58) Field of Classification Search
CPC ......... H01B 7/0072; H01B 7/423; H01B 9/02
USPC .............................. 174/47, 15.1, 15.5, 15.6
See application file for complete search history.

(56) References Cited

U.S. PATENT DOCUMENTS

| | | | | |
|---|---|---|---|---|
| 5,384,430 A | * | 1/1995 | Anthony | H01B 7/046 174/102 R |
| 6,711,328 B2 | * | 3/2004 | Griffioen | F16L 7/00 385/100 |
| 7,193,150 B2 | * | 3/2007 | Bello | H01B 7/0072 174/36 |
| 7,402,754 B2 | * | 7/2008 | Kirwan, Jr. | A61B 18/12 174/110 R |
| 8,847,069 B2 | * | 9/2014 | Emme | H01B 7/423 174/15.1 |
| 9,321,362 B2 | | 4/2016 | Woo et al. | |

FOREIGN PATENT DOCUMENTS

| | | | |
|---|---|---|---|
| DE | 4209928 | * | 12/1992 |
| DE | 102011100389 A1 | | 5/2012 |
| EP | 2652754 B1 | | 10/2013 |

* cited by examiner

*Primary Examiner* — Chau N Nguyen
(74) *Attorney, Agent, or Firm* — RatnerPrestia

(57) ABSTRACT

A charging cable assembly for transmitting electrical energy between a power supply station and an electrically drivable vehicle with a charging cable outer sheathing, in which at least one current conductor cable with a current conductor outer sheathing and at least one coolant line with a heat transfer surface are arranged, there being provided at least one heat transfer layer, which lies at least partially against the heat transfer surface and the current conductor outer sheathing.

5 Claims, 2 Drawing Sheets

CHARGING CABLE ASSEMBLY

CROSS-REFERENCE TO RELATED APPLICATION

Figure 1:
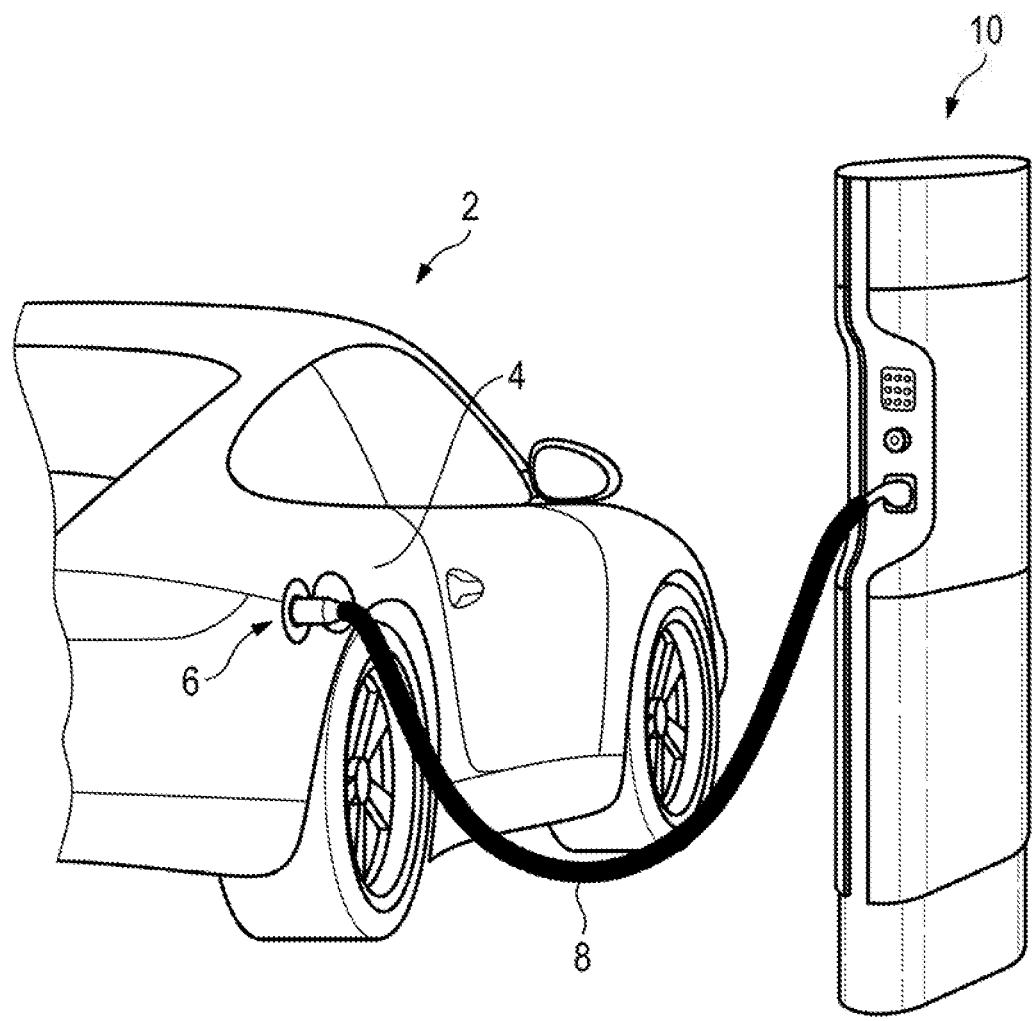

This application claims priority to German Patent Application No. DE 10 2017 105 985.7, filed Mar. 21, 2017, which is incorporated by reference herein in its entirety.

FIELD OF THE INVENTION

The invention relates to a charging cable assembly for transmitting electrical energy between a power supply station and an electrically drivable vehicle with a charging cable outer sheathing, in which at least one current conductor cable with a current conductor outer sheathing and at least one coolant line with a heat transfer surface are arranged.

BACKGROUND OF THE INVENTION

Motor vehicles with at least one electric motor as a drive motor must be charged at charging stations in order that they can store the energy necessary for driving the motor vehicle. For this purpose, the motor vehicle has an electrical energy store and a connector, which can be connected directly or indirectly to a power supply station by means of a charging cable assembly. In order to speed up the charging operation, fast charging stations are used as power supply stations, whereby strong electric currents are transmitted. These electric currents sometimes cause the current conductor cables provided in the charging cable assembly to heat up. In order to achieve small cable cross sections in this case, it is necessary for there to be a cooling device in the charging cable assembly.

The prior art, such as for example EP 2 652 754 B1, which is incorporated by reference herein, DE 10 2011 100 389 A1, which is incorporated by reference herein, or U.S. Pat. No. 9,321,362 B2, which is incorporated by reference herein, discloses in this respect charging cable assemblies in which at least one current conductor cable with a coolant line having a heat transfer surface to cool the current conductor cable is provided. However, it has been found that with such assemblies a high cooling effort is required to limit excessive heating of the current conductor cables.

SUMMARY OF THE INVENTION

One object of the invention is therefore to ensure cooling of the current conductor cables that is as efficient as possible in a low-cost and easy way.

This object may be achieved by providing at least one heat transfer layer, which lies at least partially against the heat transfer surface and the current conductor outer sheathing. In this way, a homogeneous distribution of the temperature and heat flux density present on the current conductor outer sheathing is ensured. The current conductor outer sheathing gives off heat to the heat transfer layer, which in turn is in heat exchange with the coolant lines.

In a particularly advantageous embodiment, the heat transfer layer comprises silver, copper and/or aluminum as the heat conducting material.

In a particularly advantageous way, the heat transfer layer is formed flexibly as a gauze, mesh or film, whereby it is possible to deform the heat transfer layer in an easy way, and accordingly adapt it to the current conductor outer sheathing.

In a particularly compact advantageous embodiment, two current conductor cables and two coolant lines are arranged alternately in the clockwise direction, while there is provided a heat transfer layer which extends around the sides of the heat transfer surfaces of the coolant lines that are facing away from one another and around the sides of the current conductor outer sheathings of the current conductor cables that are facing one another. Provided in addition, or else on its own, there may be a heat transfer layer which extends around the sides of the heat transfer surfaces of the coolant lines and of the current conductor outer sheathings of the current conductor cables that are facing away from one another. In particular, this layer which extends around the sides of the current conductor outer sheathings of the current conductor cables that are facing away from one another may additionally serve as EM shielding when operating with alternating current. To ensure contact surfaces for lateral heat transfer that are as large as possible, in the charging cable assembly there may be provided a protective conductor and/or signal lines and/or filling material, which increase the compactness of the charging cable assembly.

BRIEF DESCRIPTION OF THE INVENTION

Figure 2:
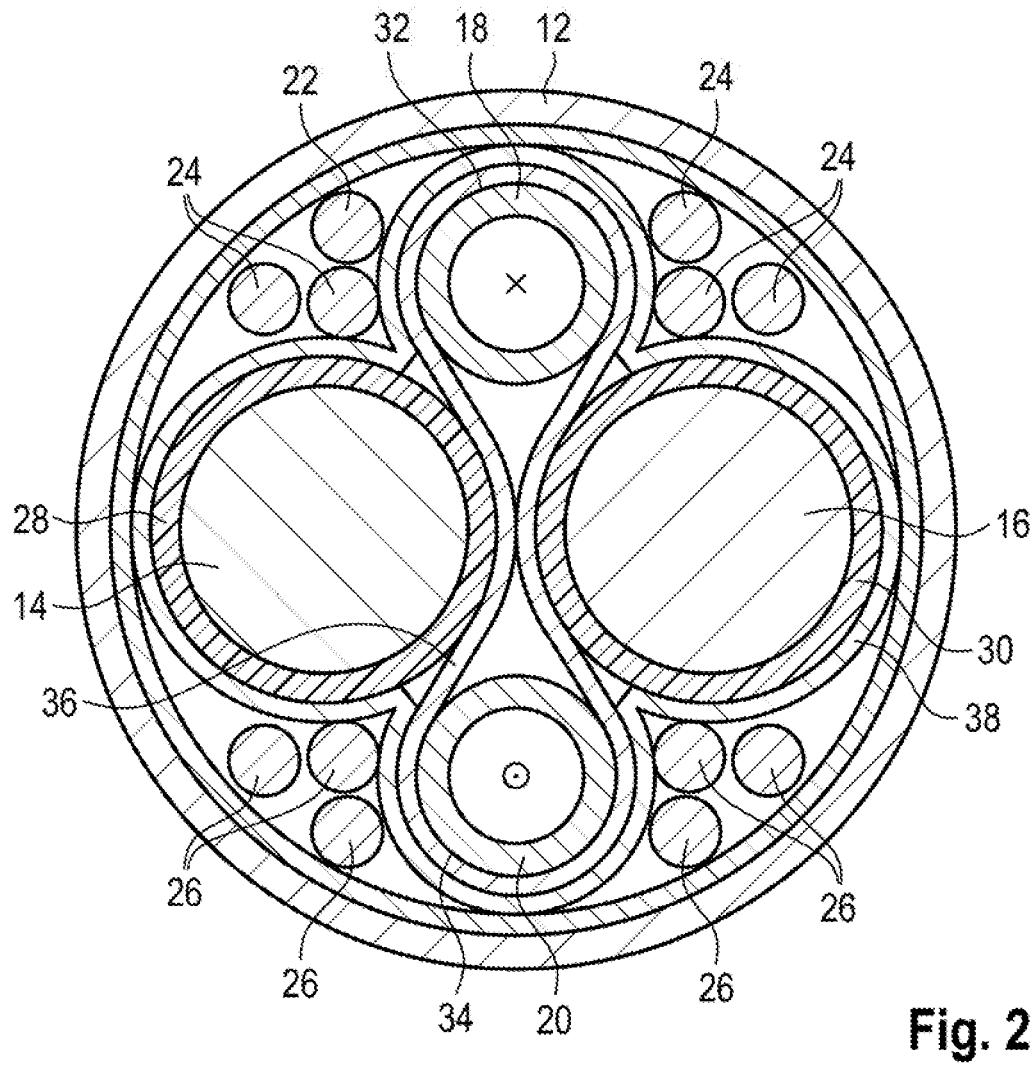

The invention is explained in more detail on the basis of a drawing, in which:

FIG. 1 shows a perspective view of a plug-in motor vehicle that is connected to a stationary power supply station, and FIG. 2 shows a cross-sectional view of a charging cable assembly according to aspects of the invention.

DETAILED DESCRIPTION OF THE INVENTION

FIG. 1 shows in a perspective view a motor vehicle 2, the vehicle body 4 of which has a charging connection device 6. This charging connection device 6 is connected to a stationary electrical power supply station 10 by way of a charging cable assembly 8.

FIG. 2 shows the charging cable assembly 8 in a cross-sectional view. The charging cable assembly 8 has here a charging cable outer sheathing 12, in which two current conductor cables 14, 16 and two coolant lines 18, 20 are arranged in the present exemplary embodiment. Also provided are a protective conductor 22, signal lines 24 and filling material 26. The current conductor cables 14, 16 have in each case a current conductor outer sheathing 28, 30. The coolant lines 18, 20 have in each case a heat transfer surface 32, 34. According to aspects of the invention, a first and a second heat transfer layer 36, 38 are then provided. The heat transfer layers 36, 38 consist substantially of copper and are formed as a gauze, in order to allow them to be flexibly laid. In the present exemplary embodiment, the two coolant lines 18, 20 and the two current conductor cables 14, 16 are arranged alternately in the clockwise direction. Here, the first heat transfer layer 36 is provided in such a way that it extends around the sides of the heat transfer surfaces 32, 34 of the coolant lines 18, 20 that are facing away from one another and around the sides of the current conductor outer sheathings 28, 30 of the current conductor cables 14, 16 that are facing one another. Specifically, the heat transfer layer 36 is wrapped around and directly contacts a majority of the heat transfer surface 32, 34 of each coolant line 18, 20 and at least partially extends around and directly contacts the current conductor outer sheathing 28, 30 of each current conductor cable 14, 16. The second heat transfer layer 38 is provided in such a way that it extends around the sides of the heat transfer surfaces 32, 34 of the coolant lines 18, 20 that are facing away from one another and around the sides of the current conductor outer sheathings 28, 30 of the current conductor cables 14, 16 that are facing away from one another.

It should be clear that in this way an optimum heat exchange in the charging cable assembly 8 is ensured.

What is claimed is:

1. A charging cable assembly for transmitting electrical energy between a power supply station and an electrically drivable vehicle, the charging cable assembly comprising:
    a charging cable outer sheathing in which is arranged (i) two current conductor cables each having a current conductor outer sheathing, and (ii) two coolant lines each having a heat transfer surface, and
    at least one heat transfer layer, which lies at least partially against the heat transfer surface of each coolant line and the current conductor outer sheathing of each current conductor cable,
    wherein the two current conductor cables and the two coolant lines are arranged alternately in a clockwise direction, wherein the heat transfer layer extends around sides of the heat transfer surfaces of the coolant lines that face away from one another and around sides of the current conductor outer sheathings of the current conductor cables that face one another.

2. The charging cable assembly as claimed in claim 1, wherein the heat transfer layer comprises silver, copper or aluminum.

3. The charging cable assembly as claimed in claim 1, wherein the heat transfer layer is formed flexibly as a gauze, mesh or film.

4. The charging cable assembly as claimed in claim 1, wherein a second heat transfer layer extends around sides of the heat transfer surfaces of the coolant lines and sides of the current conductor outer sheathings of the current conductor cables that face away from one another.

5. The charging cable assembly as claimed in claim 1, further comprising one or more of a protective conductor, signal lines or a filling material.

* * * * *